(12) United States Patent
Jiang et al.

(10) Patent No.: US 7,924,010 B2
(45) Date of Patent: Apr. 12, 2011

(54) APPARATUS FOR SUPPORTING AND METHOD FOR FORMING A SUPPORT FOR A MAGNETIC RESONANCE IMAGING (MRI) MAGNET

(75) Inventors: Longzhi Jiang, Florence, SC (US); John Scaturro, Jr., Florence, SC (US); Clifford Ginfrida, Jr., Florence, SC (US)

(73) Assignee: General Electric Company, Schenectady, NY (US)

( * ) Notice: Subject to any disclaimer, the term of this patent is extended or adjusted under 35 U.S.C. 154(b) by 85 days.

(21) Appl. No.: 12/410,959

(22) Filed: Mar. 25, 2009

(65) Prior Publication Data

US 2010/0244824 A1    Sep. 30, 2010

(51) Int. Cl.
*G01V 3/00* (2006.01)
(52) U.S. Cl. .................................. 324/318; 324/322
(58) Field of Classification Search .............. 324/318, 324/322; 335/216
See application file for complete search history.

(56) References Cited

U.S. PATENT DOCUMENTS

| | | | | |
|---|---|---|---|---|
| 4,467,303 | A * | 8/1984 | Laskaris | 335/216 |
| 5,630,971 | A * | 5/1997 | Ophir | 264/101 |
| 5,668,516 | A * | 9/1997 | Xu et al. | 335/216 |
| 5,727,353 | A | 3/1998 | Getz et al. | |
| 6,011,394 | A * | 1/2000 | Petropoulos et al. | 324/318 |
| 6,275,128 | B1 | 8/2001 | Aoki et al. | |
| 6,598,824 | B2 * | 7/2003 | Schmidt | 242/603 |
| 7,013,553 | B2 | 3/2006 | Elgin, II et al. | |
| 7,242,191 | B2 | 7/2007 | Laskaris et al. | |
| 7,459,909 | B2 | 12/2008 | Yao et al. | |
| 7,498,814 | B1 | 3/2009 | Huang et al. | |
| 2004/0251901 | A1 | 12/2004 | Tsuda et al. | |

* cited by examiner

*Primary Examiner* — Louis M Arana
(74) *Attorney, Agent, or Firm* — Dean Small; The Small Patent Law Group

(57) ABSTRACT

An apparatus and method for supporting a magnetic resonance imaging magnet are provided. The apparatus includes a magnet coil support structure having a main former body with a plurality of channels and an end flange at each end of the main former body. The end flanges are reinforced with a strengthening material at least at corner regions of the end flanges.

21 Claims, 9 Drawing Sheets

APPARATUS FOR SUPPORTING AND METHOD FOR FORMING A SUPPORT FOR A MAGNETIC RESONANCE IMAGING (MRI) MAGNET

BACKGROUND OF THE INVENTION

The subject matter disclosed herein relates generally to diagnostic imaging systems, and more particularly to an apparatus for supporting and method for forming a support for a superconducting magnet in a Magnetic Resonance Imaging (MRI) system.

MRI systems and Nuclear Magnetic Resonance (NMR) imaging systems can include a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are sequentially pulsed to create pulsed magnetic gradient fields in a bore of an MRI scanner to selectively excite a volume corresponding to the region of interest in order to acquire MR images of the region of interest. The resultant image that is generated shows the structure and function of the region of interest.

In MRI systems, the superconducting magnet is an electromagnet that is commonly formed from a plurality of superconducting magnetic coils surrounding and supported by a magnet coil support structure. When the superconducting magnetic coils are deenergized, the coils move. The magnet coil support structure maintains the position of the superconducting magnetic coils along and around the support structure.

The magnet coil support structure for MRI systems is typically formed from fiberglass cloth using a wet winding process wherein fiberglass is applied to and wound around a cylindrical shaped mandrel. During the formation of the magnet coil support structure, multiple layers of fiber cloth are dipped into a liquid epoxy and applied to the mandrel. The fiberglass is then cured to form the magnet coil support structure having a solid body. The superconducting magnet coil support structure is then removed from the mandrel and channels are cut along the exterior of the magnet coil support structure to support the superconducting magnet coils therein.

The formation of the magnet coil support structure using fiberglass cloth that results in a filament wound composite former typically does not have sufficient strength at end flanges of the former. In particular, the end flanges include shear planes at the flange corners that require the flanges to be formed as thick structures. As a result, the total length of the magnet coil support structure and complete magnet assembly is longer. Accordingly, short magnet designs for MRI systems are very difficult or impossible to manufacture. Moreover, forming the magnet coil support structure from metal, for example, to allow shorter magnet designs, is costly.

BRIEF DESCRIPTION OF THE INVENTION

In accordance with one embodiment, a magnet coil support structure for a superconducting magnet is provided. The magnet coil support structure includes a main former body having a plurality of channels and an end flange at each end of the main former body. The end flanges are reinforced with a strengthening material at least at corner regions of the end flanges.

In accordance with another embodiment, a magnet coil support structure for a superconducting magnet is provided. The magnet coil support structure includes a main former body having a plurality of channels and an end flange coupled to each end of the main former body. The main former body and end flanges comprise different materials.

In accordance with yet another embodiment, a method for fabricating a magnet coil support structure for a superconducting magnet is provided. The method includes forming a main former body from an epoxy material and forming end flanges with reinforced corner regions. The end flanges are formed from a material different than the epoxy material forming the main former body.

In accordance with still another embodiment, a magnetic resonance imaging (MRI) system is provided that includes a gantry having a bore therethrough and a superconducting magnet within the gantry and having a hybrid magnet coil support structure supporting superconducting coils. The hybrid magnet coil support structure includes reinforced end flanges.

DETAILED DESCRIPTION OF THE INVENTION

Figure 1:
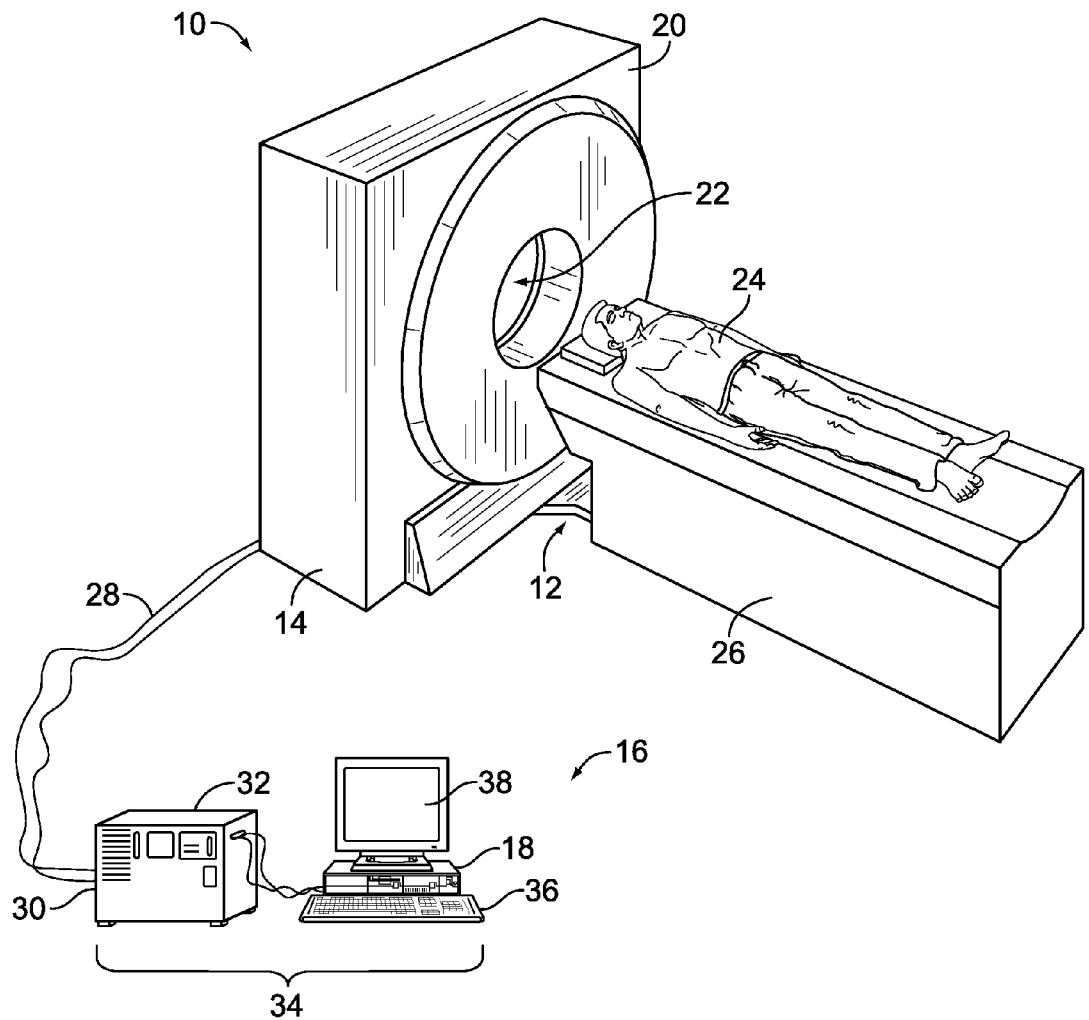
FIG. 1 is a pictorial view of an imaging system formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like).

Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide an apparatus for supporting and method for forming a support for a magnet in a Magnetic Resonance Imaging. The various embodiments provide a hybrid magnet coil support structure that is formed from more than one material or more than one process.

Various embodiments of a magnet coil support structure are provided as part of an imaging system 10 as shown in FIG. 1. It should be appreciated that although the imaging system 10 is illustrated as a single modality imaging system, the various embodiments may be implemented in or with multi-modality imaging systems. The imaging system 10 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 1, the imaging system 10 includes an imaging portion 12 that having an imaging unit 14 (e.g., imaging scanner) and a processing portion 16 that may include a processor 18 or other computing or controller device. In particular, the imaging unit 14 enables the imaging system 10 to scan an object or patient 24 to acquire image data, which may be image data of all or a portion of the object or patient 24. The imaging unit 14 includes a gantry 20 that includes one or more imaging components (e.g., magnets or magnet windings within the gantry 20) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 16 via a communication link 28 that may be wired or wireless. It should be noted that the signals may be configured in different protocols, etc. It should also be noted that during an imaging scan by the imaging unit 14, the gantry 20 and the imaging components mounted thereon or therein may remain stationary or rotate about or along a center of rotation defining an examination axis through a bore 22. The patient 24 may be positioned within the gantry 20 using, for example, a motorized table 26.

Thus, in operation an output of one or more of the imaging components is transmitted to the processing portion 16, and vice versa, which for example, may include, transmitting signals to or from the processor 18 through a control interface 30. The processor 18 also may generate control signals for controlling the position of the motorized table 26 or imaging components based on, for example, user inputs or a predetermined scan. During a scan, image data, such as magnetic resonance image data from the imaging components may be communicated to the processor 18 through a data interface 32 via the control interface 30. The processor 18 and associated hardware and software used to acquire and process data may be collectively referred to as a workstation 34. The workstation 34 includes a keyboard 36 and/or other input devices such as a mouse, a pointer, and the like, and a monitor 38. The monitor 38 displays image data and may accept input from a user if a touchscreen is available.

Figure 2:
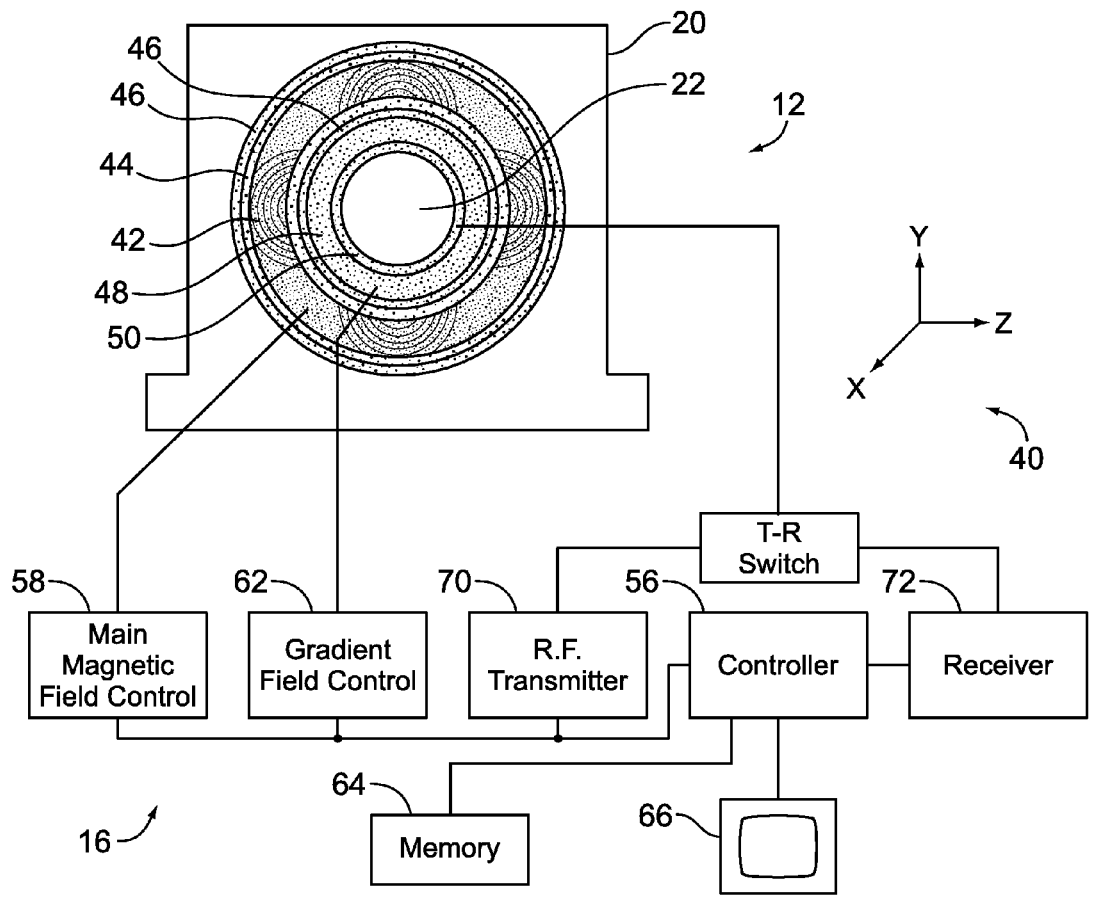
FIG. 2 is a block diagram of a magnetic resonance imaging (MRI) system formed in accordance with various embodiments.

For illustrative purposes only, various embodiments may be implemented as an MRI system 40 as shown in FIG. 2. In particular, the MRI system 40 includes within the gantry 20 a superconducting magnet 42 formed from magnetic coils supported on a magnet coil support structure as described in more detail herein. A vessel 44 surrounds the superconducting magnet 42 and is filled with liquid helium in various embodiments to cool the coils of the superconducting magnet 42. The liquid filled vessel 44 is also referred to as a cryostat. Thermal insulation 46 is provided surrounding the outer surface of the vessel 44 and the inner surface of the superconducting magnet 42. A plurality of magnetic gradient coils 48 are provided within the superconducting magnet 42 and a Radio-Frequency (RF) transmit/receive coil 50 within the plurality of magnetic gradient coils 48. The components within the gantry 20 generally form the imaging portion 12. It should be noted that although the superconducting magnet 42 is a cylindrical shaped, other shapes of magnets can be used.

The processing portion 16 generally includes a controller 56, a main magnetic field control 58, a gradient field control 62, a memory 64, a display device 66, a transmit-receive (T-R) switch 68, a radio frequency (RF) transmitter 70 and a receiver 72.

Figure 3:
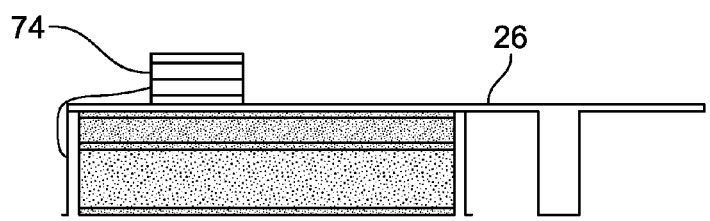
FIG. 3 is a side elevation view of a patient table and body part specific receive coil that may be used with the MRI system of FIG. 2.

In operation, a body of an object, such as the patient 24 (shown in FIG. 1) or a phantom to be imaged, is placed in the bore 22 on a suitable support, for example, the motorized table 26 (shown in FIGS. 1 and 3) or other patient table. The superconducting magnet 42 produces a uniform and static main magnetic field $B_o$ across the bore 22. The strength of the electromagnetic field in the bore 22 and correspondingly in the patient 24, is controlled by the controller 56 via the main magnetic field control 58, which also controls a supply of energizing current to the superconducting magnet 42.

The magnetic gradient coils 48, which include one or more gradient coils, is provided so that a magnetic gradient can be imposed on the magnetic field $B_o$ in the bore 22 within the superconducting magnet 42 in any one or more of three orthogonal directions x, y, and z. The magnetic gradient coils 48 are energized by the gradient field control 62 and are also controlled by the controller 56.

The RF transmit/receive coil 50, which may include a plurality of coils (e.g., resonant surface coils), is arranged to transmit magnetic pulses and/or optionally simultaneously detect MR signals from the patient 24. In some embodiments, a separate receive coil 74 (illustrated in FIG. 3 as a body part specific receive coil 74) may be provided. In some other embodiments, the RF transmit/receive coil 50 is a body part specific coil.

The RF transmit/receive coil 50 is selectably interconnected to one of the RF transmitter 70 or receiver 72 by the T-R switch 68. The RF transmitter 70 and T-R switch 68 are controlled by the controller 56 such that RF field pulses or signals are generated by the RF transmitter 70 and selectively applied to the patient 24 for excitation of magnetic resonance in the patient 24. While the RF excitation pulses are being applied to the patient 24, the T-R switch 68 is also actuated to decouple the receiver 72 from the RF transmit/receive coil 50.

Following application of the RF pulses, the T-R switch 68 is again actuated to decouple the RF transmit/receive coil 50 from the RF transmitter 70 and to couple the RF transmit/receive coil 50 to the receiver 72. The RF transmit/receive coil 50 includes detectors that operate to detect or sense the MR signals resulting from the excited nuclei in the patient 24 and communicates the MR signals to the receiver 72. These detected MR signals are in turn communicated to the controller 56. The controller 56 includes a processor (e.g., image reconstruction processor), for example, the processor 18 (shown in FIG. 1), that controls the processing of the MR signals to produce signals representative of an image of the patient 24.

The processed signals representative of the image are also transmitted to the display device 66 to provide a visual display of the image. Specifically, the MR signals fill or form a k-space that is Fourier transformed to obtain a viewable image. The processed signals representative of the image are then transmitted to the display device 66.

In operation, the magnetic field $B_o$ generated by the superconducting magnet 42 is applied to the patient 24 that lies along a z-axis of a Cartesian coordinate system, the origin of which is within the patient 24. The uniform magnetic field $B_o$ being applied has the effect of aligning nuclear spins, a quantum mechanical property of nuclei within the patient 24, along the y-axis. In response to the RF pulses of a proper resonant frequency being generated by the RF transmitter 70, and that are orientated within an x-z plane perpendicular to the y-axis, the nuclei resonate at their Larmor frequencies. In a typical imaging sequence, an RF pulse centered about the Larmor frequency is applied to the patient 24 at the same time a magnetic field gradient Gz is being applied along the z-axis by means of the magnetic gradient coils 48. The gradient Gz causes nuclei in a slice with a limited width through the patient 24 along the x-y plane, to have a resonant frequency and to be excited into resonance.

After excitation of the nuclei in the slice, magnetic field gradients Gx and Gy are applied along the x and y axes respectively. The magnetic field gradient Gx along the x-axis causes the nuclei to precess at different frequencies depending on the position of the nuclei along the x-axis. Essentially, Gx spatially encodes the precessing nuclei by frequency, referred to as frequency encoding. A y-axis gradient Gy is incremented through a series of values and encodes a y-axis rate of change of phase of the precessing nuclei as a function of the amplitude of the gradient Gy, in a process referred to as phase encoding.

It should again be noted that the various embodiments are not limited to use in connection with the MRI system 40 described herein, but may be implemented in connection with any type of system capable of acquiring images, particularly diagnostic images of a patient.

Figure 4:
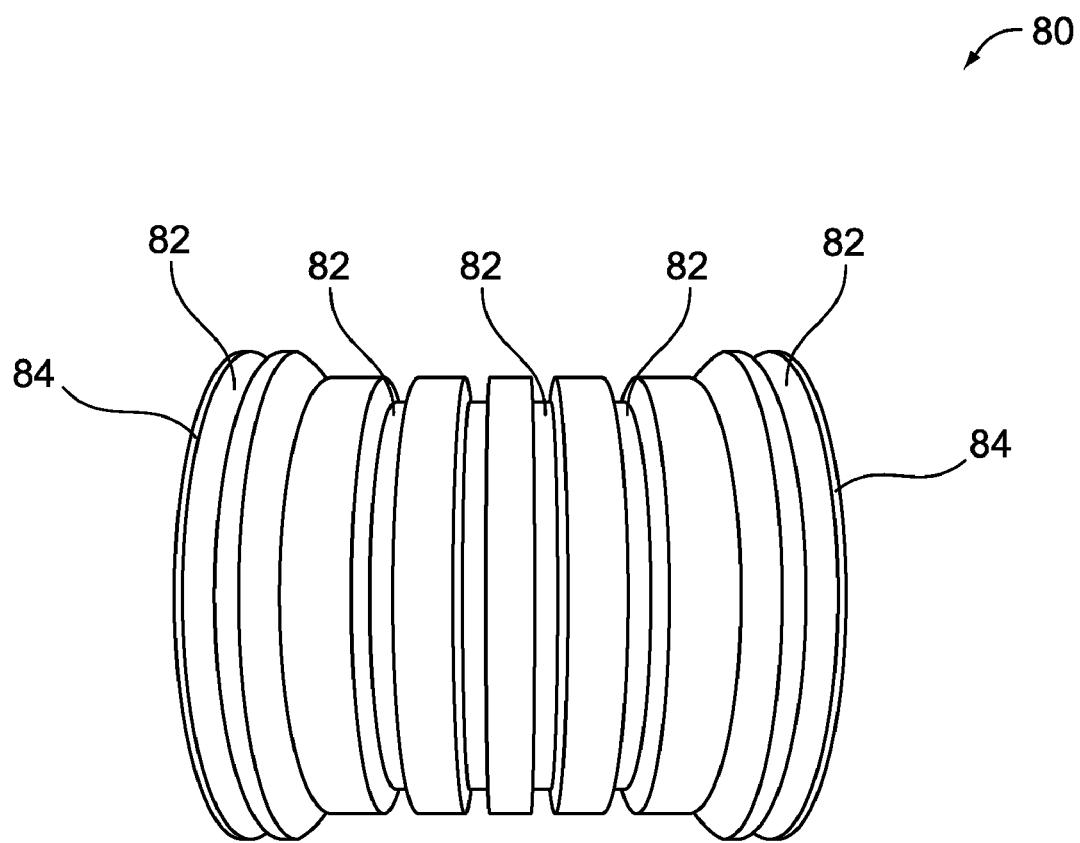
FIG. 4 is a perspective view of a magnet coil support structure formed in accordance with various embodiments.

Various embodiments provide a magnet coil support structure 80 as shown in FIG. 4 and a method for forming the magnet coil support structure 80. The magnet coil support structure 80 generally includes a plurality of channels 82 that maintain the position of superconducting magnetic coils (not shown) therein. The magnet coil support structure 80 is formed from more than one material or more than one formation process such that a hybrid coil support structure is provided. The magnet coil support structure 80 is formed to reduce or minimize a shear plane at end flanges 84 of the magnet coil support structure 80. In particular, the various embodiments provide reinforced end flanges 84 for the magnet coil support structure 80. The reinforced end flanges 84 may be formed as part of the magnet coil support structure 80, for example, during the formation of a former used to make the magnet coil support structure 80 or may be provided separately and thereafter coupled to the former to form the magnet coil support structure 80.

Figure 5:
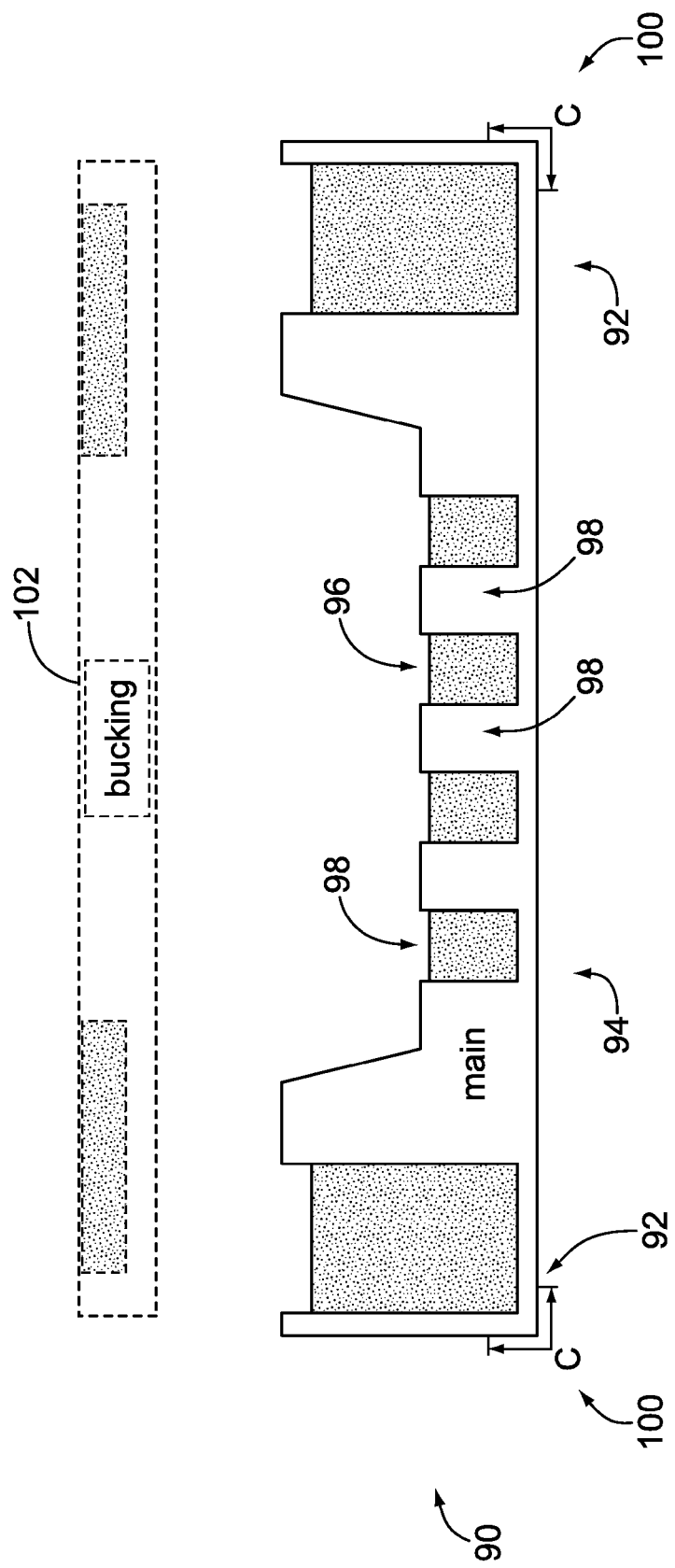
FIG. 5 is a cross-sectional view of a portion of a magnet coil support structure formed in accordance with various embodiments.

In one embodiment, a magnet coil support structure 90 as shown in FIG. 5 is formed using a strengthening material for the end flanges 92 to thereby form reinforced end flanges 92. FIG. 5 is a cross-sectional view of a portion of the magnet coil support structure 90. The magnet coil support structure 90 includes a main former body 94 having a plurality of channels 96. The channels 96 are defined by walls 96 within the main former body 94. Corner regions 100 (identified by the arrow C) are reinforced with a strengthening material when forming the end flanges 92 during the fabrication process of the main former body 94. For example, in various embodiments fiberglass material is aligned around the corner regions 100 during the fabrication process. The main former body 94 may be formed using an epoxy resin composition to form a Fiber Reinforced Plastic (FRP) using methods known in the art. During the fabrication process, and in particular, the curing process, a pre-impregnated material (prepreg), namely an intermediate reinforcing material made of a combination of an epoxy resin composition and reinforcing fibers (e.g., fiberglass fibers) is added to the corner regions 100. It should be noted that different prepreg materials may be used, for example, using a combination of an epoxy resin composition and carbon fibers. It also should be noted that a shield portion 102 is also illustrated for reference, but is not included as part of the fabrication of the magnet coil support structure 90.

Figure 6:
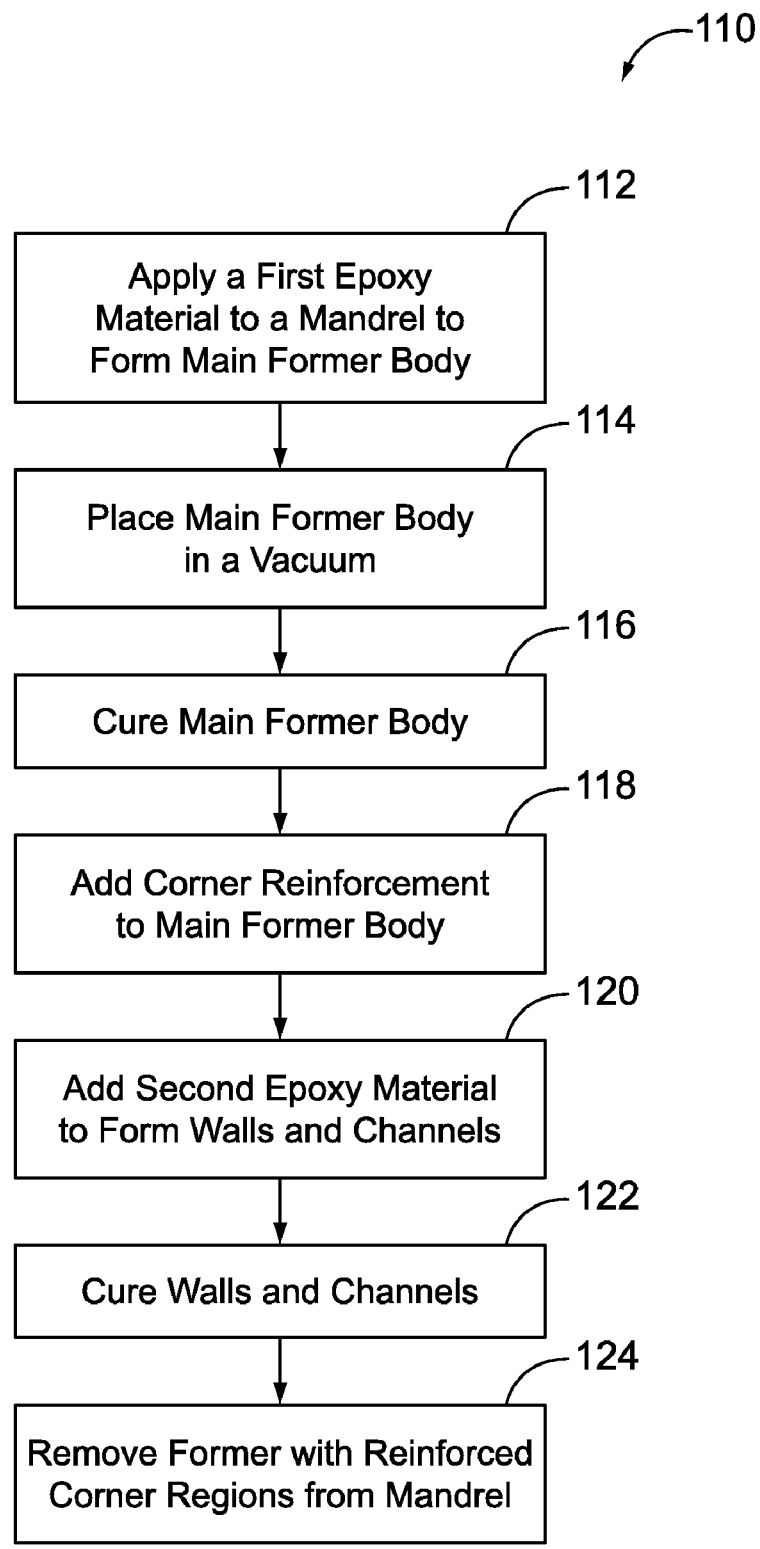
FIG. 6 is a flowchart of a method for fabricating a magnet coil support structure in accordance with various embodiments.

A method 110 for fabricating a magnet coil support structure, such as the magnet coil support structure 90 is shown in FIG. 6. The method includes at 112 applying a first epoxy material to a mandrel (or other mold or support) to form a main former body. It should be noted that instead of a mandrel a preformed support may be provided that is shaped and dimensioned according to the requirements for the main former body. For example, the dimensions of the support may be based on the vessel in which a superconducting magnet having the magnet coil support structure 90 is to be placed. Thereafter the main former body of the magnet coil support structure 90 is formed, which includes applying a first epoxy material, which may be a prepreg, to the mandrel at 112. Thereafter, at 114, the main former body is placed into a vacuum, for example, to remove the air from the prepreg material if such a material is used. The main former body is then cured in an oven as known in the art at 116.

Thereafter, at 118, corner reinforcements are added to the main former body. In particular, a strengthening material is added to the corner regions. For example, a prepreg material may be applied to the corner regions, such as fiberglass tape with epoxy. As another example, a reinforcing preformed corner member (e.g., fiberglass corner member) may be added, such as a fiberglass member sized and shaped to align with the corner region. In general, any reinforcing member or material may be used and provided at the corner regions.

A second epoxy material, which in some embodiments is a different epoxy material than the first epoxy material is applied to the main former body at 120 to form the walls and channels of the magnet coil support structure 90. It should be noted that the corner reinforcing material may be applied at the same time as the second epoxy material. The second epoxy material, for example, fiberglass cloth is stacked on the main former body in layers to fabricate the walls and channels. However, different materials may be used, for example, based on the loading and stress requirements for the walls and channels.

Thereafter, the walls and channels are cured in an oven as known in the art at 122. In particular, the layers formed from the second epoxy material are cured to form the walls and channels of the magnet coil support structure 90, which includes the reinforcing member or material at the corner regions. The completed former including the main former body having walls and channels with reinforced corners is removed from the mandrel at 124. The completed former in some embodiments is a single unitary former construction.

It should be noted that other fabrication processes may be implemented to form the magnet coil support structure 90. For example, a molding process may be performed wherein the main former body is comolded with the walls and channels and having the reinforced corner regions. The fabrication process may be any process that allows reinforced corner members or material to be formed or integrated with the former to provide the magnet coil support structure 90. In some embodiments, for example, the main former body is fabricated with the channels machined from the main former body material.

Figure 7:
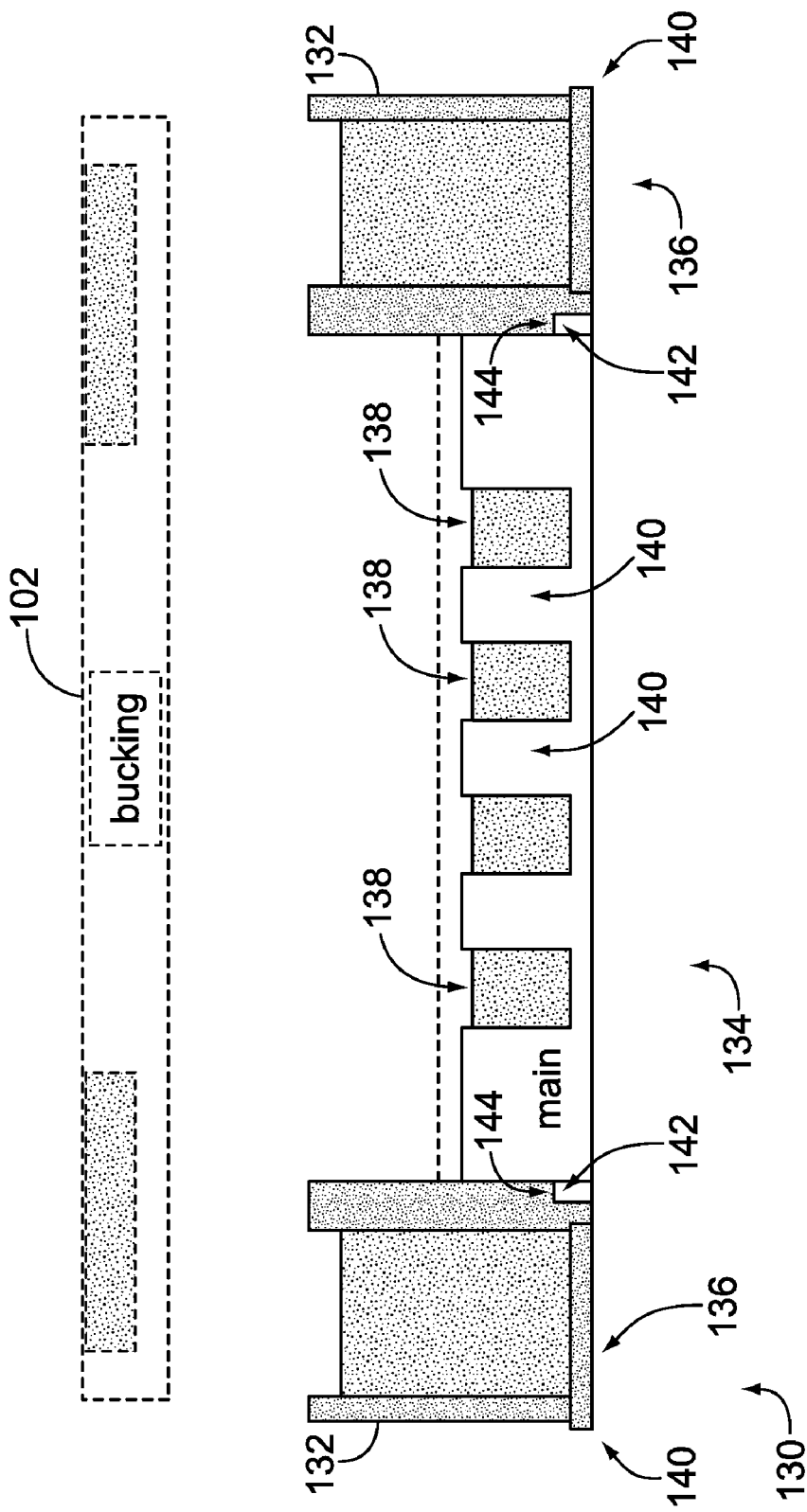
FIG. 7 is a cross-sectional view of a portion of another magnet coil support structure formed in accordance with various embodiments.

In another embodiment, a magnet coil support structure 130 as shown in FIG. 7 is formed using separate end channel members 132 that are assembled to the main former body 134 to provide reinforced end flanges 136. FIG. 7 is a cross-sectional view of a portion of the magnet coil support structure 130. The magnet coil support structure 130 includes channels 138 formed as part of the main former body 134. The channels 138 are defined by walls 140 within the main former body 134. The main former body 134 with channels 138 may be fabricated using the method 110 or other suitable process known in the art. For example, the main former body 134 may be fabricated using an epoxy resin composition to form a Fiber Reinforced Plastic (FRP) former using methods known in the art. As another example, the main former body 134 may be formed using a wet winding process, such as a filament winding process.

The end channel members 132 are provided to reduce or minimize (or eliminate) a shear plane at corner regions 140 of the end channel members 132. In various embodiments, the end channel members 132 are formed from a material having a strength that does not need reinforcing corner members or material. For example, molded end channel members 132 that are premolded may be provided in some embodiments. In other embodiments, the end channel members 132 are formed from metal, for example, steel or aluminum. In still other embodiments, the end channel members 132 are formed using a cast Reaction Injection Molded (RIM) process. The end channel members 132 resist or reduce the likelihood of shearing at the corner regions 140.

The end channel members 132 are separate from the main former body 134 and assembled or coupled thereto. For example, the end channel members 132 may be adhered or affixed to the main former body 134 using any suitable adhesive. The end channel members 132 are permanently coupled or assembled to the main former body 134. It should be noted that shoulder regions 142 and 144 of the main former body 134 and end channel members 132, respectively, may abut when coupled together to facilitate alignment and/or permanent affixing. Thus, the completed former includes the main former body 134 permanently coupled or affixed to end channel members 132, which in various embodiments is formed in a different process and from a different material than the main former body 134.

Figure 8:
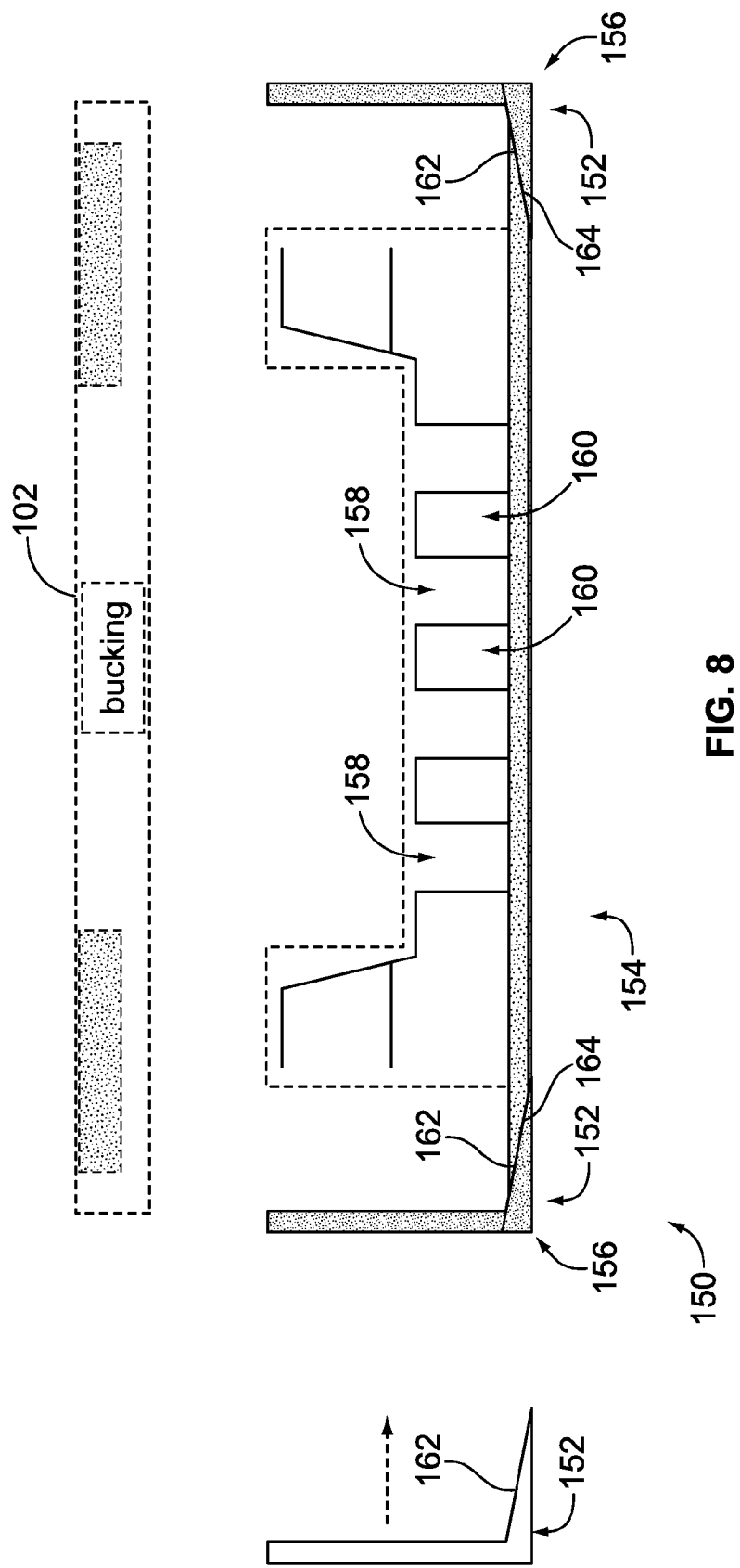
FIG. 8 is a cross-sectional view of a portion of another magnet coil support structure formed in accordance with various embodiments.

In another embodiment, a magnet coil support structure 150 as shown in FIG. 8 is formed using separate end flanges 152 that are assembled to the main former body 154 to provide reinforced corners regions 156. FIG. 8 is a cross-sectional view of a portion of the magnet coil support structure 150. The magnet coil support structure 150 includes channels 158 formed as part of the main former body 154, for example, in a machining process. The channels 158 are defined by walls 160 within the main former body 154. The main former body 154 with channels 158 may be fabricated using the method 110 or other suitable process known in the art. For example, the main former body 154 may be fabricated using an epoxy resin composition to form a Fiber Reinforced Plastic (FRP) former using methods known in the art. As another example, the main former body 154 may be formed using a wet winding process, such as a filament winding process. The main former body 154 may initially have a shape as indicated by the dashed lines in FIG. 8, with the final shape with channels 158 formed by any suitable machining process.

The end flanges 152 are provided to reduce or minimize (or eliminate) a shear plane at the corner regions 156 of the end channel members 132. In various embodiments the end flanges 152 are formed from a material having a strength that does not need reinforcing corner members or material. For example, the end flanges 152 are discrete flanges or rings formed from a prepreg material, such as a combination of an epoxy resin material and reinforcing fibers. The end flanges 152 resist or reduce the likelihood of shearing at the corner regions 156.

The end flanges 152 are separate from the main former body 154 and assembled or coupled thereto. For example, the end flanges 152 may be adhered or affixed to the main former body 154 using any suitable adhesive or glue as illustrated by the arrow in FIG. 8. The end flanges 152 are permanently coupled or assembled to the main former body 154. It should be noted that each of the end flanges 154 include angled engagement regions 162 that abut complementary angled engagement regions 164 at ends of the main former body 154 when coupled together to facilitate alignment and/or permanent affixing. In other embodiments, and for example, fiber claws are used around the corner regions 156 to couple the end flanges 152 to the main former body 154. Thus, the completed former includes the main former body 154 permanently coupled or affixed to end flanges 152, which in various embodiments is formed in a different process and from a different material than the main former body 154.

Figure 9:
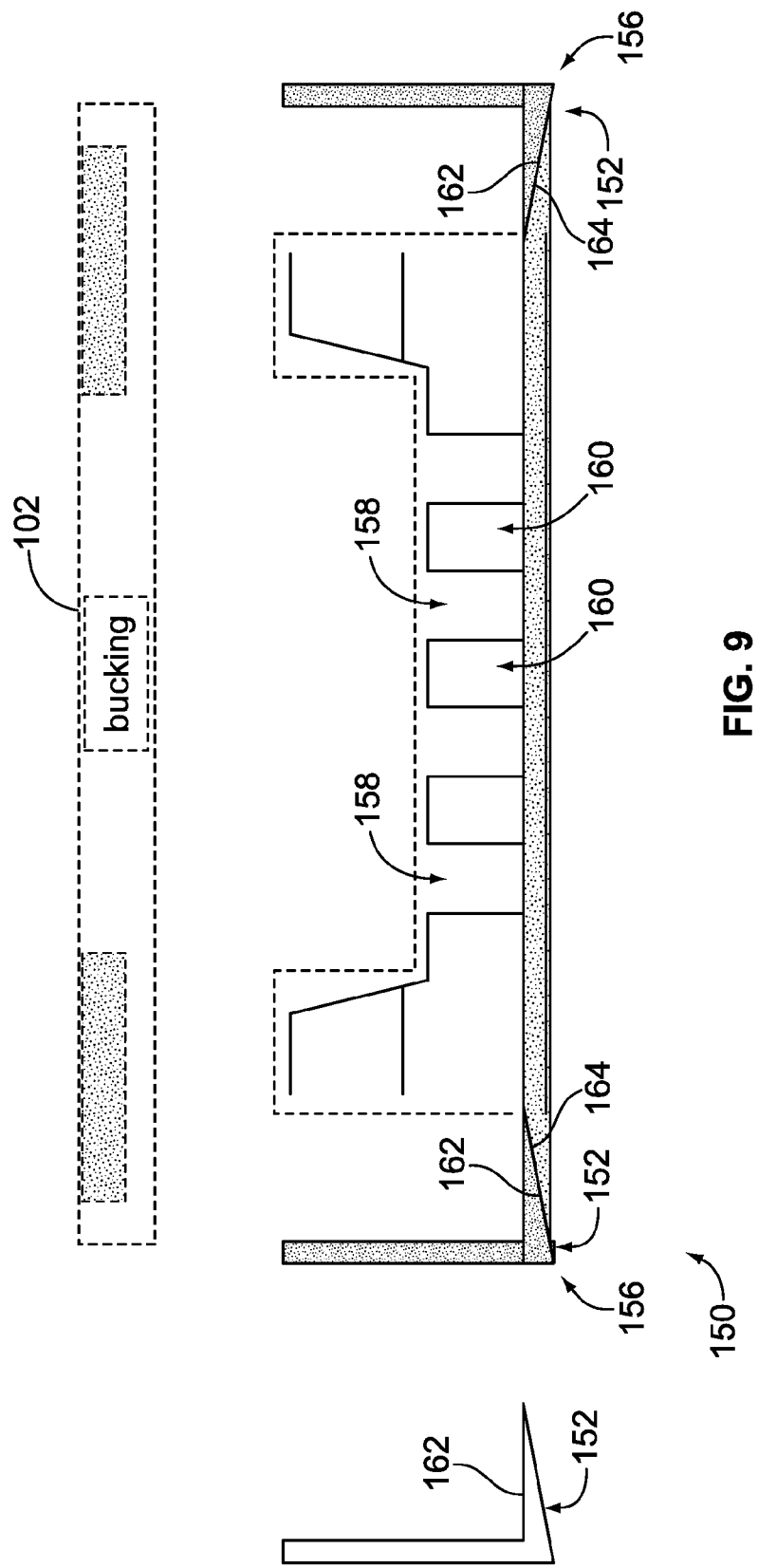
FIG. 9 is a cross-sectional view of a portion of another magnet coil support structure formed in accordance with various embodiments.

It should be noted that in other embodiments, for example, as shown in FIG. 9, the end flanges 152 are formed from metal, for example, steel or aluminum. It also should be noted that the angled engagement regions 162 and 164 may be inclined or declined and vice versa. Additionally, other coupling means may be used, for example, using fiberglass around the corner regions 156.

Figure 10:
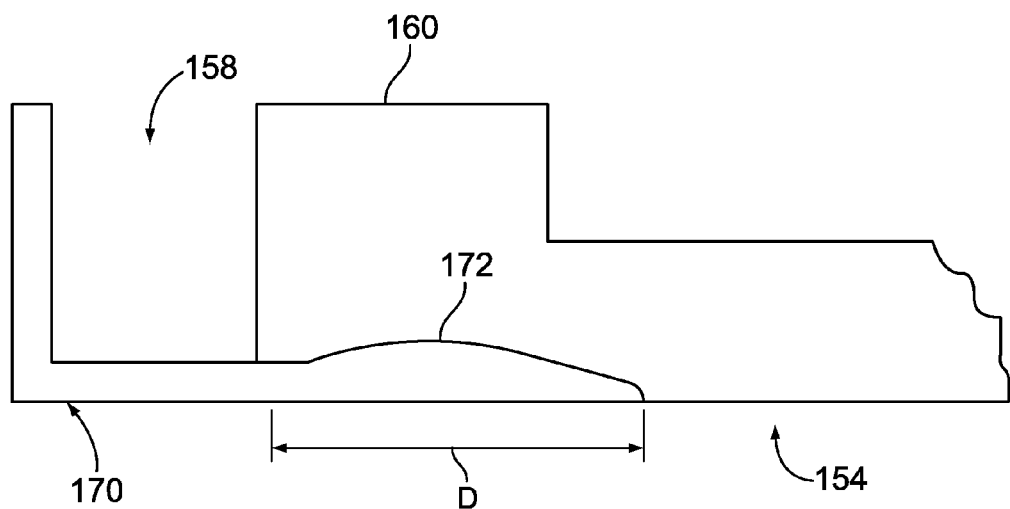
FIG. 10 is a cross-sectional view of a portion of another magnet coil support structure formed in accordance with various embodiments.
Figure 11:
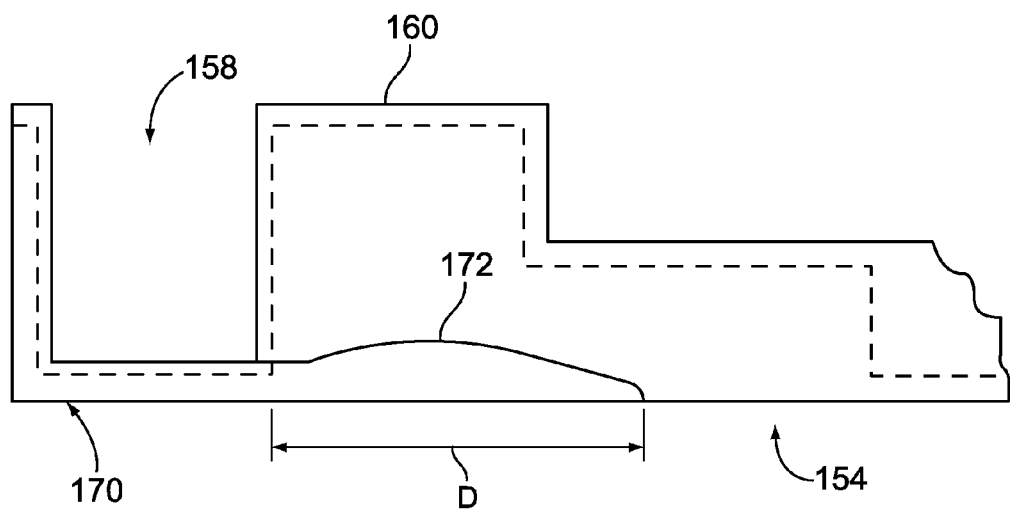
FIG. 11 is a cross-sectional view of the portion of the magnet coil support structure of FIG. 10 illustrating a machined main former body.

In other embodiments, instead of the angled engagement regions 162 and 164, end flanges 170 may include a curved engagement region 172 (illustrated as a "bump") that couples the end flanges 170 to the main former body 154 as shown in FIGS. 10 and 11. In these embodiments, the end flanges 170 are separately formed, then epoxied to and cured with main former body 154. The main former body 154 may initially have a shape as indicated by the dashed lines in FIG. 11, with the final shape with channels 158 formed by any suitable machining process. The main former body 154 may be formed from a prepreg material or one having a honeycomb core.

It should be noted that in some embodiments the curved engagement regions 172 extend a distance D into the main former body 154. For example, in some embodiments, the curved engagement regions 172 extend about 2.5 inches to about 3 inches into the main former body 154.

Thus, the various embodiments provide a magnet coil support structure, particularly for supporting superconducting magnetic coils having reinforced end flanges. The reinforced end flanges provides for the construction of shorter magnet coil support structures, which allows for the construction of short magnet MRI systems.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnet coil support structure for a superconducting magnet, the magnet coil support structure comprising:
   a main former body having a plurality of channels; and
   an end flange forming part of each end of the main former body, the end flanges reinforced with a strengthening material at least at corner regions of the end flanges.

2. A magnet coil support structure in accordance with claim 1 wherein the strengthening material comprises a pre-impregnated material.

3. A magnet coil support structure in accordance with claim 2 wherein the pre-impregnated material comprises fiberglass.

4. A magnet coil support structure in accordance with claim 1 wherein the main former body comprises a pre-impregnated material.

5. A magnet coil support structure in accordance with claim 1 wherein the main former body and end flanges form a single unitary former piece.

6. A magnet coil support structure in accordance with claim 1 further comprising a fiberglass reinforcing member aligned with the corner regions.

7. A magnet coil support structure for a superconducting magnet, the magnet coil support structure comprising:
   a main former body having a plurality of channels; and
   an end flange coupled to and forming part of each end of the main former body and not part of a vessel in which the main former body is positioned, the main former body and end flanges comprising different materials.

8. A magnet coil support structure in accordance with claim 7 further comprising end channels forming the end flanges.

9. A magnet coil support structure in accordance with claim 7 wherein the end flanges comprise a pre-molded end flange.

10. A magnet coil support structure in accordance with claim 7 wherein the end flanges comprise a metal material.

11. A magnet coil support structure in accordance with claim 7 wherein the end flanges comprise a pre-impregnated material.

12. A magnet coil support structure in accordance with claim 7 wherein the end flanges comprise angled engagement regions that couple to complementary engagement regions of the main former body.

13. A magnet coil support structure in accordance with claim 7 wherein the end flanges comprise curved engagement regions extending into the main former body.

14. A magnet coil support structure in accordance with claim 7 wherein the end flanges are adhered to the main former body.

15. A magnet coil support structure in accordance with claim 7 wherein the end flanges comprise discrete flanges.

16. A method for fabricating a magnet coil support structure for a superconducting magnet, the method comprising:
   forming a main former body from an epoxy material; and
   forming end flanges with reinforced corner regions extending circumferentially along at least one end of the main former body, the end flanges formed from a material different than the epoxy material forming the main former body.

17. A method in accordance with claim 16 wherein forming the main former body and forming the end flanges are performed in separate fabrication processes.

18. A method in accordance with claim 16 further comprising aligning a support material around the corner regions.

19. A magnetic resonance imaging (MRI) system comprising:
   a gantry having a bore therethrough; and
   a superconducting magnet within the gantry and having a hybrid magnet coil support structure supporting superconducting coils, the gantry including a vessel, the hybrid magnet coil support structure having reinforced end flanges and being within the vessel, and wherein the reinforced end flanges are separate from the vessel.

20. An MRI system in accordance with claim 19 wherein the hybrid magnet coil support structure includes a main former body comprising a material different than a material of the end flanges.

21. An MRI system in accordance with claim 19 wherein the reinforced end flanges are not welded to the vessel.

* * * * *